US011747368B2

(12) United States Patent
Roberts et al.

(10) Patent No.: US 11,747,368 B2
(45) Date of Patent: *Sep. 5, 2023

(54) SENSING MOTOR CURRENT

(71) Applicant: CMR SURGICAL LIMITED, Cambridge (GB)

(72) Inventors: Paul Christopher Roberts, Cambridge (GB); Edward John Mottram, Cambridge (GB)

(73) Assignee: CMR SURGICAL LIMITED, Cambridge (GB)

(*) Notice: Subject to any disclaimer, the term of this patent is extended or adjusted under 35 U.S.C. 154(b) by 0 days.

This patent is subject to a terminal disclaimer.

(21) Appl. No.: 17/663,624

(22) Filed: May 16, 2022

(65) Prior Publication Data
US 2022/0276284 A1    Sep. 1, 2022

Related U.S. Application Data

(63) Continuation of application No. 17/195,717, filed on Mar. 9, 2021, now Pat. No. 11,353,481, which is a
(Continued)

(30) Foreign Application Priority Data

Dec. 2, 2016   (GB) ..................... 1620524

(51) Int. Cl.
*G01R 15/20*   (2006.01)
*H02P 6/28*    (2016.01)
(Continued)

(52) U.S. Cl.
CPC .......... *G01R 15/202* (2013.01); *G01R 19/32* (2013.01); *G01R 33/0005* (2013.01);
(Continued)

(58) Field of Classification Search
CPC .. G01R 15/202; G01R 19/32; G01R 33/0005; G01R 33/0076; G01R 33/0082;
(Continued)

(56) References Cited

U.S. PATENT DOCUMENTS 5,821,725 A * 10/1998 Wang ........................ H02P 6/10
318/803
6,646,407 B2 * 11/2003 Rahman ................ H02P 25/092
318/162

(Continued)

FOREIGN PATENT DOCUMENTS

CN         1761114 A      4/2006
CN       101009474 A      8/2007
(Continued)

OTHER PUBLICATIONS

Chinese First Notification of Office Action from corresponding Chinese Application No. 201780074656..X dated Apr. 20, 2021 [English language translation of the Office Action is attached].

(Continued)

*Primary Examiner* — Giovanni Astacio-Oquendo
(74) *Attorney, Agent, or Firm* — Lando & Anastasi, LLP

(57) ABSTRACT

A circuit for sensing the driving current of a motor, the circuit comprising: a driver configured to generate a driving current for each phase of a multiple-phase motor, the instantaneous sum of all the driving currents being zero; a current sensor for each phase of the multiple-phase motor, each current sensor configured to measure the driving current of that phase and comprising a plurality of current sensor elements arranged with respect to each other such that each current sensor element has the same magnitude of driving current systematic error due to magnetic fields external to the driving current to be measured; and a controller configured to, for each phase of the multiple-phase motor, generate an estimate of the driving current of that phase to be the (Continued)

measured driving current of that phase minus 1/n of the total of the measured driving currents for all phases, n being the number of phases of the multiple-phase motor.

20 Claims, 3 Drawing Sheets

Related U.S. Application Data continuation of application No. 16/465,650, filed as application No. PCT/GB2017/053641 on Dec. 1, 2017, now Pat. No. 10,976,353.

(51) Int. Cl.
*G01R 19/32* (2006.01)
*G01R 33/00* (2006.01)
*G01R 35/00* (2006.01)

(52) U.S. Cl.
CPC ..... *G01R 33/0076* (2013.01); *G01R 33/0082* (2013.01); *G01R 35/00* (2013.01); *H02P 6/28* (2016.02)

(58) Field of Classification Search
CPC .......................... G01R 35/00; G01R 33/0017; G01R 19/0092; H02P 6/28; H02P 21/22
USPC ........................... 324/106, 105, 76.11
See application file for complete search history.

(56) References Cited

U.S. PATENT DOCUMENTS

| | | | |
|---|---|---|---|
| 9,041,390 B1 | 5/2015 | Nguyen et al. | |
| 10,090,790 B2 | 10/2018 | Sambonsuge et al. | |
| 10,184,960 B2 | 1/2019 | Nakayama | |
| 2002/0185989 A1* | 12/2002 | Rahman | H02P 25/098 318/701 |
| 2003/0185024 A1* | 10/2003 | Lethellier | H02M 3/1584 363/65 |
| 2004/0227485 A1 | 11/2004 | Matsubara et al. | |
| 2005/0051379 A1 | 3/2005 | Nagase | |
| 2005/0178609 A1 | 8/2005 | Uryu | |
| 2006/0082357 A1 | 4/2006 | Tsukamoto | |
| 2007/0057662 A1 | 3/2007 | Yakymyshyn et al. | |
| 2007/0205749 A1 | 9/2007 | Yakymyshyn et al. | |
| 2008/0231219 A1* | 9/2008 | Mori | H02P 3/22 318/434 |
| 2010/0130986 A1 | 5/2010 | Mailloux et al. | |
| 2015/0002139 A1 | 1/2015 | Lu | |
| 2015/0219692 A1 | 8/2015 | Krah et al. | |
| 2016/0124059 A1 | 5/2016 | Notaros et al. | |
| 2016/0124060 A1 | 5/2016 | Giri et al. | |
| 2016/0181965 A1* | 6/2016 | Hayashi | H02P 29/024 318/8 |
| 2016/0202331 A1 | 7/2016 | Chen et al. | |
| 2016/0223594 A1 | 8/2016 | Suzuki et al. | |
| 2016/0231364 A1 | 8/2016 | Nejatali et al. | |
| 2016/0276969 A1 | 9/2016 | Krefta | |
| 2016/0341772 A1 | 11/2016 | Roberts et al. | |
| 2017/0310218 A1 | 10/2017 | Chan et al. | |
| 2020/0280268 A1 | 9/2020 | Mutsuura et al. | |

FOREIGN PATENT DOCUMENTS

| | | | |
|---|---|---|---|
| CN | 102866290 | A | 1/2013 |
| CN | 103941080 | A | 7/2014 |
| CN | 104698252 | A | 6/2015 |
| CN | 105991082 | A | 10/2016 |
| CN | 106291049 | A | 1/2017 |
| EP | 1508497 | A1 | 2/2005 |
| EP | 1805886 | A2 | 7/2007 |
| EP | 1855118 | A1 | 11/2007 |
| EP | 2202527 | A1 | 6/2010 |
| GB | 825137 | A | 12/1959 |
| JP | 200559786 | A | 3/2005 |
| JP | 2006112968 | A | 4/2006 |
| JP | 2013170878 | A | 9/2013 |
| JP | 2016145830 | A | 8/2016 |
| WO | 2006039662 | A2 | 4/2006 |
| WO | 2012050711 | A1 | 4/2012 |
| WO | 2016067982 | A1 | 5/2016 |
| WO | 2016148032 | A1 | 9/2016 |

OTHER PUBLICATIONS

Extended European Search Report from corresponding European Application No. 22151784.0 dated Apr. 19, 2022.
Indian Examination Report from corresponding Indian Application No. 201927025875 dated Feb. 23, 2022.
International Search Report and Written Opinion from corresponding PCT/GB2017/05361 dated Mar. 9, 2018.
Japanese Notification of Reasons for Refusal from corresponding Japanese Patent Application No. 2019-529493 dated Dec. 1, 2021 [English translation attached].
United Kingdom Search Report from corresponding United Kingdom Application No. GB1620524.7 dated Mar. 27, 2017.
United Kingdom Search Report from corresponding United Kingdom Application No. GB2001723.2 dated Oct. 13, 2020.

* cited by examiner

SENSING MOTOR CURRENT

CROSS-REFERENCE TO RELATED APPLICATIONS

This application is a continuation of U.S. patent application Ser. No. 17/195,717 filed Mar. 9, 2021, which is a continuation of U.S. patent application Ser. No. 16/465,650 filed May 31, 2019 [now U.S. Pat. No. 10,976,353], which is a U.S. National Phase Application under 35 U.S.C. § 371 of International Application No. PCT/GB2017/053641, filed Dec. 1, 2017 [Expired], which claims priority to United Kingdom Application No. 1620524.7, filed Dec. 2, 2016. Each application referenced above is hereby incorporated by reference in its entirety for all purposes.

BACKGROUND

In systems which are controlled by a motor, it is desirable to accurately sense the current that is being driven through the motor. Typically, the current along with several other parameters is monitored and input to a feedback control loop which refines the operation of the motor. For example, in a DC motor, the current, shaft position, speed and direction of the rotating motor may all be measured, and those measurements input to a motor control circuit, which forms control inputs to the driver to adjust the operation of the motor.

A current sense resistor can be used to measure the driving current of a motor. A shunt resistor is placed in the motor drive line such that it receives the driving current prior to the motor. The voltage drop across the resistor is measured, for example by a differential amplifier, thereby yielding the driving current. Current sense resistors are resistant to thermal changes in their surroundings and to external electromagnetic fields.

However, power is dissipated in a shunt resistor, thus the current sense resistor is an intrusive current sensing mechanism: the current output from the current sense resistor to the motor is lower than that input to it. The power dissipated in the shunt resistor increases quadratically as the resistance increases. At the high currents typically used to drive motors, the waste heat generated by a current sense resistor can exceed the temperature threshold to which the motor and/or surrounding circuitry can safely be exposed. Additionally, the motor and surrounding circuitry is typically subject to a power limit, which is exceeded by the current sense resistor at high currents.

To satisfy the power limit and reduce the intrusiveness of the sensor, the resistor can be reduced in size. However, the output signal of the current sense resistor increases linearly with resistance, so by reducing the resistance, the sensitivity of the current sense resistor is reduced. Very small currents cause a very small voltage drop, which may be undetectable over the background noise level. Thus, current sense resistors having low resistance have output signals with low signal to noise ratios. Smaller resistors are more inaccurate, which leads to an increased error in the output signal. Additionally, motors are typically driven with high frequency current. At low resistance, the impedance of a resistor is dominated by inductance rather than resistance. Thus, the driving current cannot be derived as straightforwardly as described above.

An alternative sensor to a current sense resistor is a Hall sensor. A Hall sensor is a magnetic current sensor which is activated by an external magnetic field acting on it. It is thus able to provide a non-intrusive measurement of the current being driven through a motor by detecting the magnetic field generated by the current flow. The Hall sensor produces an output voltage which varies as a function of the magnetic field density around it. Hence, by measuring the output voltage of a Hall sensor located in close proximity to the path of the driver output, the driving current of the motor is determined. None of the measured driving current is dissipated by the Hall sensor. Hall sensors thus do not suffer from the waste heat and power problems of current sense resistors.

Large Hall sensors are available which are insensitive to changes in their thermal surroundings and external electromagnetic fields. However, these are not suitable for small, lightweight applications. In such applications, it is desirable for the footprint of the current sensor to be as small as possible, and the weight of the current sensor to be minimised. Small Hall sensors are available which can be packaged into a small IC. However, these Hall sensors suffer from the problem that their operation is very sensitive to their thermal surroundings and to external electromagnetic fields, for example those from magnets in the motor. As a motor is driven, the circuit boards on which the motor and the Hall sensor are located increase in temperature to levels outside of the narrow temperature window at which the Hall sensor provides an accurate current measurement.

There is thus a need to provide a non-intrusive current sensor for accurately measuring the driving current of a motor which is suitable for small, lightweight applications.

SUMMARY OF THE INVENTION

According to an aspect of the invention, there is provided a circuit for sensing the driving current of a motor, the circuit comprising: a driver configured to generate a driving current for each phase of a multiple-phase motor, the instantaneous sum of all the driving currents being zero; a current sensor for each phase of the multiple-phase motor, each current sensor configured to measure the driving current of that phase; and a controller configured to, for each phase of the multiple-phase motor, generate an estimate of the driving current of that phase to be the measured driving current of that phase minus 1/n of the total of the measured driving currents for all phases, n being the number of phases of the multiple-phase motor.

The driver may be configured to generate a succeeding driving current of each phase of the multiple-phase motor in response to a control input, the control input comprising the estimate of the driving current of each phase.

The controller may be configured to generate an estimate of the error of each measured driving current to be equal to 1/n of the total of the measured driving currents for all phases.

The multiple-phase motor may have three phases.

Each current sensor may comprise a plurality of current sensor elements, each current sensor element configured to measure the driving current of the phase thereby generating a driving current reading, the measured driving current of that phase being a combination of the driving current readings of the current sensor elements.

The plurality of current sensor elements of each current sensor may be arranged with respect to each other such that each current sensor element has the same magnitude of driving current systematic error due to magnetic fields external to the driving current to be measured.

The plurality of current sensor elements of each current sensor may comprise two current sensor elements arranged in an opposing orientation.

The controller may be configured to calculate the measured driving current of that phase to be half the sum of the driving current readings of the two current sensor elements.

The plurality of current sensor elements of each current sensor may comprise two current elements arranged in the same orientation and wired in series in opposition.

The controller may be configured to calculate the measured driving current of the phase to be half the difference of the driving current readings of the two current sensor elements.

The plurality of current sensor elements of each current sensor may comprise two current elements arranged in an opposing orientation and wired in parallel.

The controller may be configured to calculate the measured driving current of the phase to be the sum of the driving current readings of the two current sensor elements.

Each current sensor element may be a Hall sensor configured to output a Hall voltage, the driving current reading being a function of the Hall voltage.

The circuit may further comprise a temperature sensor configured to measure the circuit temperature, and output a measured circuit temperature to the controller.

The controller may be configured to: receive a first calibration temperature measurement from the temperature sensor and a first calibration Hall voltage from a current sensor element of a phase of the multiple-phase motor, both measurements taken concurrently during circuit disconnection; receive a second calibration temperature measurement from the temperature sensor and a second calibration Hall voltage from the said current sensor element, both measurements taken concurrently during circuit connection; and derive a thermal calibration profile of the Hall voltage of the said current sensor element from the received calibration measurements.

The controller may be configured to calibrate the measured driving current of a phase prior to generating an estimate of the driving current of that phase.

The thermal calibration profile may be linear, and the controller may be configured to calibrate the measured driving current of a phase by deducting a linear offset from each driving current reading of the current sensor elements of that phase in accordance with the thermal calibration profiles of those current sensor elements.

The controller may be configured to receive the first calibration temperature measurement and the first calibration Hall voltage which were taken during circuit disconnection at start-up.

The controller may be configured to receive the first calibration temperature measurement and the first calibration Hall voltage which were taken during a period of motor disconnection during use.

The controller may be configured to receive the second calibration temperature measurement and the second calibration Hall voltage which were taken during circuit connection when the driving current of that phase was momentarily driven to zero by the driver following a period of higher driving current of that phase.

The circuit may further comprise a magnetic shield which encompasses all the current sensors.

The magnetic shield may comprise two shield layers arranged on either side of the current sensors.

The magnetic shield may comprise a further shield element located between the motor and the current sensors.

The magnetic shield may be composed of Mu-metal.

BRIEF DESCRIPTION OF THE FIGURES

The present invention will now be described by way of example with reference to the accompanying drawings. In the drawings.

DETAILED DESCRIPTION

The current being driven through a motor depends on the particular application. For example, it depends on the components that the motor is configured to drive. In many applications, the driving current varies significantly in magnitude, and may be very high. For example, the current may be up to 50 A. The driving current may also have a large frequency bandwidth, and may have a very high frequency. For example, the bandwidth may be ~50 kHz. Thus, the circuitry used to sense the current is usefully sensitive over a large frequency bandwidth and able to accurately detect high currents. In addition, the circuitry usefully has a small footprint and is able to generate a current measurement in a non-intrusive manner. Hall sensors are able to measure high magnitude and high frequency currents in a non-intrusive way over a small footprint. Hall sensors generate a real-time current measurement. As the driving current changes, the magnetic field it generates changes, and hence the voltage output by the Hall sensor changes. Thus, the current measurement derived from the Hall sensor updates at the frequency of the driving current. This current measurement has a high signal to noise ratio, thus is subject to little filtering. It is therefore accurate at high bandwidths as well as low bandwidths. Thus, the Hall sensor is accurate for measuring high and low speed current signals.

However, as discussed above, Hall sensors have poor thermal stability. This leads to large systematic errors in their current measurements as their ambient temperature deviates from the small temperature window over which their performance is stable. They are also very sensitive to external electromagnetic fields. Fields arising from nearby circuitry, such as from magnets in the motor, and even the earth's magnetic field are picked up by the Hall sensor along with the field from the driving current, causing errors in the current measurement.

The following describes circuitry of a motor control circuit which is used to mitigate the thermal and/or electromagnetic sensitivity of a small Hall sensor (i.e. one that can be integrated onto an IC), thereby enabling the Hall sensor to be used to accurately measure the driving current of a motor.

Figure 1:
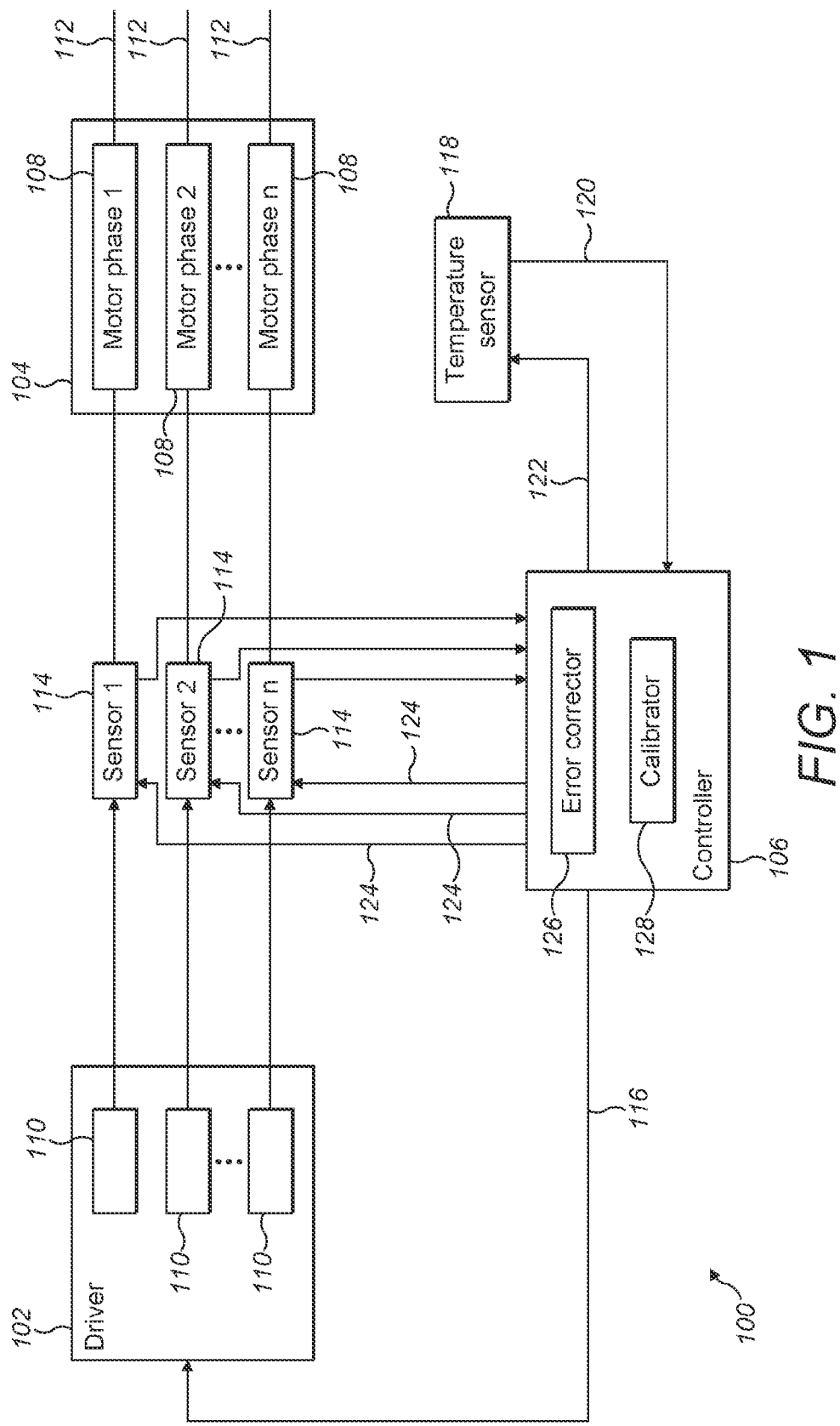
FIG. 1 illustrates a motor control circuit.

FIG. 1 illustrates an exemplary motor control circuit 100. Driver 102 drives motor 104 under the control of controller 106. The depicted motor 104 is a multiple-phase motor having n motor phases 108, where n is a positive number. For example, the motor may be a brush less DC motor. The motor may be a three-phase motor, for example in a wye or delta winding arrangement. The motor may have greater than or fewer than three motor phases. In FIG. 1, each motor phase is driven separately by a respective driving element 110 of driver 102. Thus, there are n motor drive lines from the driver 102 to the motor 104, one for each of the n motor phases 108. The motor 104 has n motor output lines 112, one for each of the n motor phases 108.

The motor control circuit further comprises n current sensors 114, one in each motor drive line between the driver and the motor. The driving current output by each driving element 110 is measured by one of the current sensors 114 before it is input to its respective motor phase 108. Suitably, each current sensor 114 is a Hall sensor. Each current sensor outputs its driving current measure to the controller 106. The controller 106 outputs a control input 116 to the driver 102 in dependence on the measurements received from the current sensors 114. The driver generates the driving currents for the respective motor phases in dependence on control signal 116. The driver may drive the motor drive lines independently. In this case, the control signal 116 comprises a control input for each driving element 110. Thus, the driving current for a specific motor phase is produced by a driving element in dependence on the sensed driving current for that motor phase only. Alternatively, the driver may drive the motor drive lines in dependence on the sensed driving currents for a plurality or all of the sensed driving currents. In this case, the control signal 116 may comprise only one control input for all of the driving elements 110.

The driver may select the current to drive the motor in dependence on other sensed parameters in addition to the current. For example, one or more of the shaft position, speed, torque and direction of the rotating motor may also be measured, and those measurements fed back to the controller 106 to generate control signals to send to the driver to adjust the operation of the motor.

The driver may select the current to drive the motor in dependence on inputs other than those sensed and received in a feedback loop. For example, external inputs to change one or more of the direction, speed or torque of the motor may be received by the controller 106. The controller then generates control signals in dependence on these inputs to send to the driver to adjust the operation of the motor.

In an exemplary implementation, the multiple-phase motor is arranged such that, at any point in time, the sum of the driving currents of then motor phases is zero:

$$\Sigma_{i=1}^{i=n} I_i = 0 \quad \text{(equation 1)}$$

where I is the current.

Figure 2:
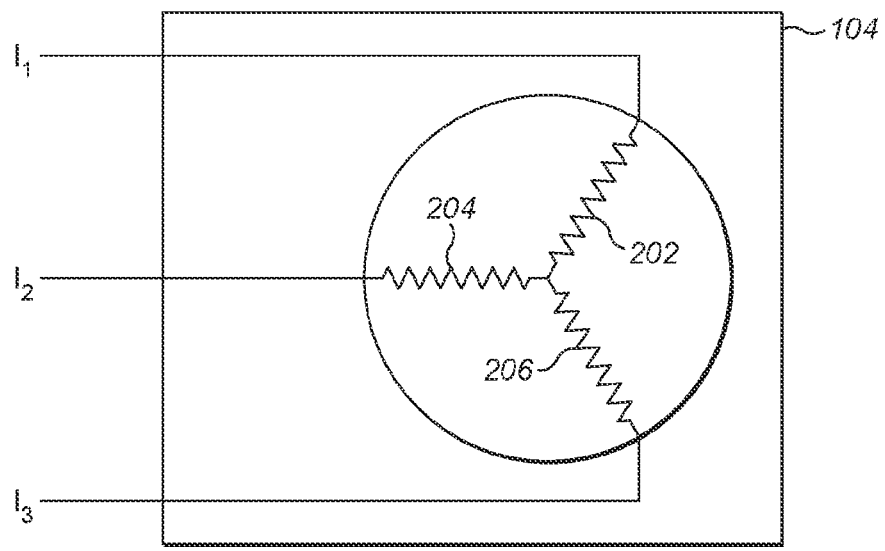
FIG. 2 illustrates a three-phase motor in a wye winding arrangement.

FIG. 2 illustrates a three-phase motor in a wye winding arrangement. All three windings 202, 204, 206 are connected. In FIG. 2:

$$I_1 + I_2 + I_3 = 0 \quad \text{(equation 2)}$$

The driving current measurement taken by each Hall sensor 114 is subject to an error due to the thermal and electromagnetic sensitivities of the Hall sensor described above.

$$I_i^m = I_i + e_i^m \quad \text{(equation 3)}$$

where $I^m$ is the measured current, and $e^m$ is the error.

As a result of the errors, the sum of the measured driving currents of all the sensors is not zero.

$$\Sigma_{i=1}^{i=n} I_i^m \neq 0 \quad \text{(equation 4)}$$

Instead, the sum of the measured driving currents of all the sensors is:

$$I^{SUM} = \Sigma_{i=1}^{i=n} I_i^m = \Sigma_{i=1}^{i=n} I_i + \Sigma_{i=1}^{i=n} e_i^m \quad \text{(equation 5)}$$

Thus, $$I^{SUM} = \Sigma_{i=1}^{i=n} I_i^m = \Sigma_{i=1}^{i=n} e_i^m \quad \text{(equation 6)}$$

In the example of FIG. 2, the sum of the measured driving currents of all the sensors, $I^{SUM}$, is:

$$I^{SUM} = I_1 + e_1^m + I_2 + e_2^m + I_3 + e_3^m \quad \text{(equation 7)}$$

Thus, $$I^{SUM} = e_1^m + e_2^m + e_3^m \quad \text{(equation 8)}$$

Each Hall sensor can be considered to be subject to the same error. Thus, $$e_1^m = e_2^m = \ldots e_n^m \quad \text{(equation 9)}$$

In a motor control circuit integrated onto an IC, the Hall sensors 114 are within close proximity of each other. For example, they may be separated by $<~6$ mm. Suitably, the Hall sensors 114 are oriented in the same direction with respect to the circuit board on which they are mounted. Thus, the external electromagnetic field experienced by each Hall sensor is substantially the same. Thus, the approximation that the Hall sensors are subject to the same error is reasonable.

Thus, the error of each measured driving current can be considered to be:

$$e_i^m = \frac{I^{SUM}}{n} \quad \text{(equation 10)}$$

For the example of FIG. 2:

$$e_1^m = e_2^m = e_3^m = \frac{I^{SUM}}{3} \quad \text{(equation 11)}$$

The driving current of each motor phase can thus be estimated as:

$$I_i^{EST} = I_i^m - \frac{I^{SUM}}{n} \quad \text{(equation 12)}$$

where $I_n^{EST}$ is the estimated driving current of the nth motor phase.

In the example of FIG. 2:

$$I_1^{EST} = I_1^m - \frac{I^{SUM}}{3}$$

$$I_2^{EST} = I_2^m - \frac{I^{SUM}}{3}$$

$$I_3^{EST} = I_3^m - \frac{I^{SUM}}{3}$$

(equations 13)

The controller 106 receives the measured driving currents $I_1^m, I_2^m \ldots I_n^m$ of then motor phases from the n Hall sensors 114. Error corrector 126 of controller 106 generates an estimated driving current $I_1^{EST}, I_2^{EST} \ldots I_n^{EST}$ for each of the n motor phases. The error corrector 126 may additionally generate an estimate of the error $e_1^m, e_2^m \ldots e_n^m$ of each of the measured driving currents. The controller outputs a control signal 116 to the driver 102. This control signal comprises the estimated driving current for each of the n motor phases. The driver generates the driving current of each motor phase in response to the control signal. For example, if the estimated driving current of a motor phase is below a desired value, then the driver 102 may respond by increasing the current input to that phase of the motor. Similarly, if the estimated driving current is above a desired value, then the driver 102 may respond by decreasing the current input to that phase of the motor.

Figure 3:
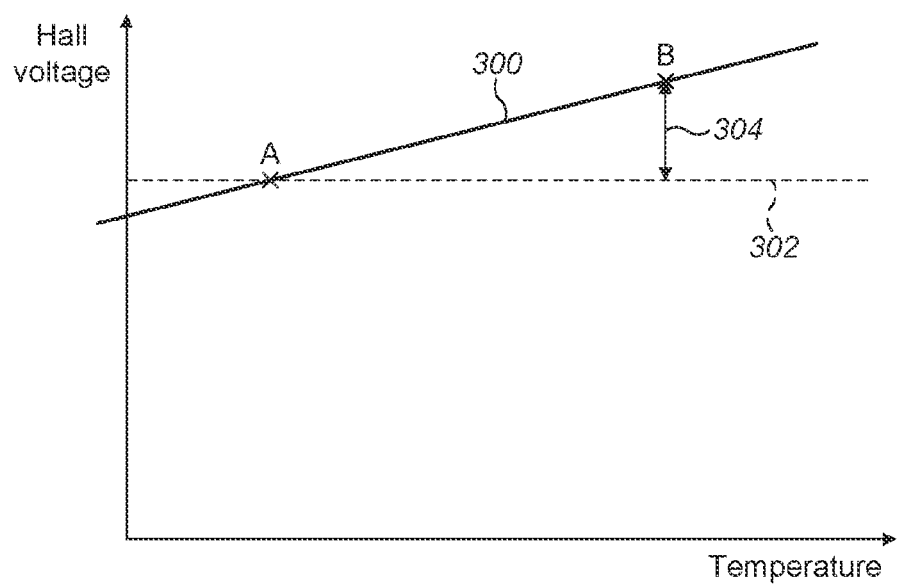
FIG. 3 is a plot illustrating the relationship between Hall voltage and temperature.

As described above, Hall sensors are sensitive to their thermal surroundings. The output voltage of the Hall sensor is subject to a temperature offset. The offset changes with the ambient temperature of the Hall sensor. The ambient temperature of the Hall sensor is generally the operating temperature of the circuit board on which the motor is being driven. The temperature range of the circuit board depends on the application. The temperature of the circuit board may vary from −40° C. to 125° C. The temperature of the circuit board may vary from 15° C. to 60° C. The drift of the Hall sensor output voltage with temperature over the operational temperature range of the circuit board can be approximated to be a linear relationship, as shown in FIG. 3. FIG. 3 is a graph in which the Hall voltage measured by a Hall sensor is plotted against temperature for the same motor driving current. As shown on FIG. 3, the Hall voltage increases linearly with temperature when subject to the same magnetic field density.

The driving current measured by each Hall sensor 114 is a function of the Hall voltage of that Hall sensor. Suitably, each Hall sensor outputs its Hall voltage to the controller 106. The controller 106 then calibrates the Hall voltage of each Hall sensor according to a thermal calibration profile so as to correct the Hall voltage reading for thermal drift. The controller then determines an estimate of the driving current of the motor phase sensed by that Hall sensor utilising the thermally calibrated Hall voltage reading.

The motor control circuit may comprise a temperature sensor 118. Temperature sensor 118 measures the circuit temperature, and outputs 120 the measured circuit temperature to the controller 106. The temperature sensor 118 may continually or periodically measure the temperature and output it to the controller 106. Alternatively, the temperature sensor 118 may measure and output the circuit temperature in response to a control signal 122 from the controller 106.

The controller performs a calibration in order to derive the thermal calibration profile of the Hall sensor. Two pairs of calibration measurements (marked A and B on FIG. 3) are taken and output to the controller. Each pair of calibration measurements comprises a temperature measurement taken by the temperature sensor 118 and a Hall voltage from the Hall sensor 114. The temperature and Hall voltage are measured concurrently by their respective sensors. The Hall sensor 114 may take and output the Hall voltage in response to receiving a control input 124 from the controller 106. The temperature sensor 118 may take and output the temperature measurement in response to receiving a control input 122 from the controller 106.

The driving current of the motor phase is the same during both pairs of calibration measurements. For example, the driving current of the motor phase may be zero during both pairs of calibration measurements. The temperature that the Hall sensor is exposed to is greater during calibration pair B than calibration pair A. The first pair of calibration measurements A may be taken during a period of circuit disconnection. During this period, the driving current of the motor phase is zero. For example, the first pair of calibration measurements A may be taken during circuit start-up prior to operation of the circuit. At this time, the circuit board temperature is the same as the temperature of the circuit board's surroundings (i.e. room temperature). Alternatively, the first pair of calibration measurements A may be taken during a short disconnection of the motor whilst the motor is in operation. The inductive time constant of the motor is very short, thus the heat energy generated by the motor quickly dissipates and the temperature of the circuit board returns to the temperature of the circuit board's surroundings. Thus, after a motor disconnection of ~1 μs, the first pair of calibration measurements A may be taken.

The second pair of calibration measurements B are taken concurrently during a time of circuit connection when the circuit board has increased in temperature as a result of the motor circuit being in operation. The driving current of the motor phase is the same during the second pair of calibration measurements B as it was during the first pair of calibration measurements A. Thus, if the driving current of the motor phase was zero during the first pair of calibration measurements A, then the driving current of the motor phase is also zero during the second pair of calibration measurements B. In order to take the second pair of calibration measurements B, the controller may output a control signal to the driver to cause the driving current of that motor phase to momentarily be zero. Prior to this time, the driving current of the motor phase was higher. The controller receives a Hall voltage reading from the Hall sensor and a temperature measurement from the temperature sensor which were taken concurrently whilst the driving current of that motor phase was zero. The controller may send a control signal to both the Hall sensor and the temperature sensor to stimulate them to take and output the second pair of calibration measurements B.

Calibrator 128 of controller 106 receives the two pairs of calibration measurements A and B. The calibrator derives a thermal calibration profile of the Hall voltage of the Hall sensor from the calibration measurements A and B. The relationship between the Hall voltage and temperature is assumed to be linear, as shown by line 300 on FIG. 3. In reality, the relationship between the Hall voltage and temperature will deviate from a precisely linear relationship. However, in the temperature range to which the Hall sensor is likely to be exposed in a motor circuit, a linear relationship is a good approximation. Thus, the thermal calibration profile is linear. Since the driving current of the motor phase that the Hall sensor was detecting was the same at calibration measurements A and B, the Hall voltage reading, once corrected for thermal drift, should be the same. The Hall sensor is accurate at the temperature of measurement A, but not at the higher temperature of measurement B. Thus, line 302 on FIG. 3 illustrates the Hall voltage which would have been measured across the temperature range had it not been subject to thermal drift. Line 302 intersects the Hall voltage calibration measurement A. Since it is known that Hall voltage measurement B should have been the same as Hall voltage measurement A, the linear offset between Hall voltage measurement B and Hall voltage measurement A is known. This linear offset is depicted by 304 on FIG. 3. From this, a thermal calibration function is derived for that Hall sensor. The thermal calibration function is a temperature dependent linear offset.

During subsequent operation, the temperature sensor 118 takes regular temperature measurements, which it outputs to the controller. The calibrator receives the Hall voltage measured by the Hall sensor. It uses the most recently received temperature measurement to determine the linear offset. It then calibrates the Hall voltage reading for thermal drift by deducting the linear offset from the Hall voltage reading. Having done this, the controller may then apply the further error correction methods described herein so as to generate an estimate of the driving current of the motor phase.

Suitably, the controller performs the calibration individually for each Hall sensor in the motor control circuit, thereby deriving a thermal calibration profile for each Hall sensor. The controller then calibrates each Hall sensor output voltage using the thermal calibration profile of that Hall sensor. In an alternative approach, the controller may perform the calibration on just one Hall sensor in the motor control circuit, and then calibrate the Hall voltage from each Hall sensor in the motor control circuit using the thermal calibration profile of the calibrated Hall sensor. Alternatively, the controller may derive an average thermal calibration profile for all the Hall sensors in the motor control circuit by receiving calibration temperature measurements from each of the Hall sensors and averaging them. The controller then calibrates the Hall voltage of each Hall sensor using the average thermal calibration profile. The latter two approaches minimise the storage space and power required to perform the thermal calibration for the motor control circuit.

Each Hall sensor 114 may comprise a single Hall sensor element. Alternatively, each Hall sensor 114 may comprise a plurality of Hall sensor elements. Each of the plurality of Hall sensor elements of a Hall sensor 114 independently measures the driving current of the motor phase to form a driving current reading. The driving current measured by the Hall sensor 114 is a combination of the driving current readings of the individual Hall sensor elements of that Hall sensor. The Hall sensor may comprise any number of Hall sensor elements. Suitably, the number of Hall sensor elements is chosen to be a number of harmonics that the motor control circuit is not sensitive to.

In the following examples, the Hall sensor consists of two Hall sensor elements. Two Hall sensor elements can be mounted on the same plane as the motor drive line whose current they are measuring. The two Hall sensor elements form a differential pair of Hall sensors. The two Hall sensor elements are arranged with respect to each other such that each Hall sensor element has the same magnitude of systematic error in the Hall voltage due to magnetic fields external to the driving current being measured. This is achieved by the relative positions of the Hall sensor elements and/or the manner in which they are each wired. The driving current readings of the two Hall sensor elements are combined so as to eliminate this systematic error, such that the resultant driving current measurement of the Hall sensor 114 as a whole is not subject to this systematic error.

Figure 4:
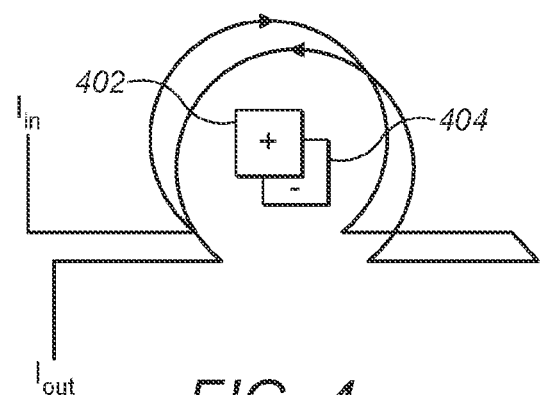
FIGS. 4, 5 and 6 illustrate arrangements of differential Hall sensor elements.
Figure 5:
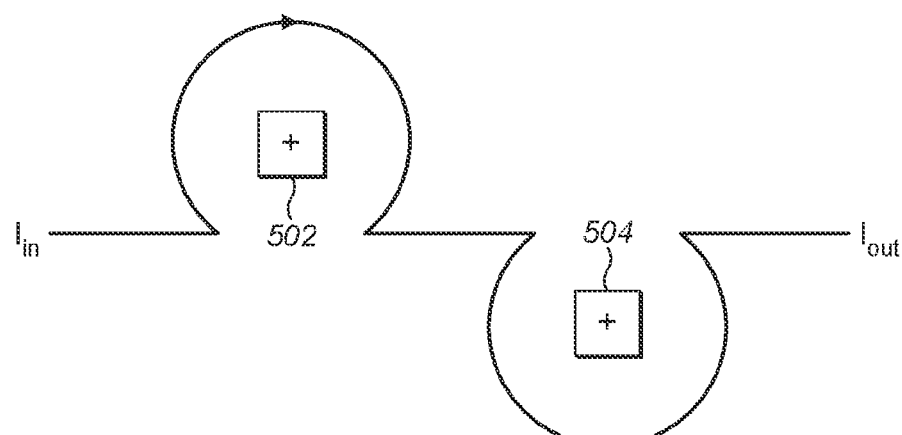
Figure 6:
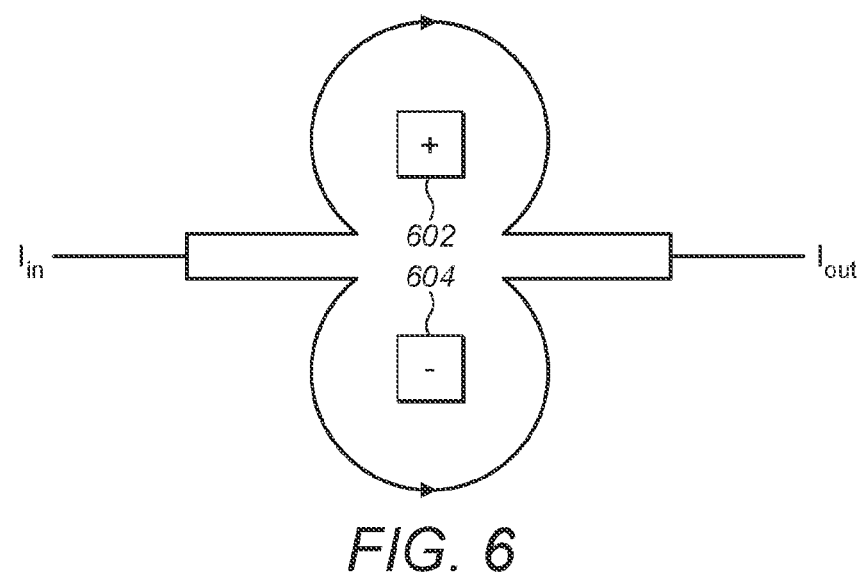

FIGS. 4, 5 and 6 illustrate example arrangements of two Hall sensor elements of a Hall sensor 114. The + and − graphics indicate the orientation of the sensor. Sensors marked + and + are in the same orientation. Sensors marked + and − are in opposing orientations.

In FIG. 4, the Hall sensor elements are arranged back to back on the circuit board. Both Hall sensor elements 402 and 404 measure positive current, I. However, the Hall sensor elements are in opposing orientations. Thus, the systematic error due to external magnetic fields measured by Hall sensor element 402 is opposite to the systematic error due to external magnetic fields measured by Hall sensor element 404. The current measurement from Hall sensor element 402 is:

$$I^{m1}=I+e_m+e' \quad \text{(equation 14)}$$

where $I^m$ is the measured current, I is the true current, and $e_m$ is the error due to external magnetic fields, and e' is other sources of error (such as error due to thermal drift).

The current measurement from Hall sensor element 404 is:

$$I^{m2}=I-e_m+e' \quad \text{(equation 15)}$$

On receiving these current measurement readings from these Hall sensor elements, the controller determines the current measurement of the Hall sensor as a whole by adding the current measurement readings together and then halving the result:

$$I^m = \frac{I^{m1} + I^{m2}}{2} \quad \text{(equation 16)}$$

$$I^m = I + e' \quad \text{(equation 17)}$$

The error due to external magnetic fields $e_m$ is thereby eliminated from the current measurement of the Hall sensor, $I^m$.

In FIG. 5, the Hall sensor elements are arranged side by side on the circuit board. The Hall sensor elements are wired in series. The Hall sensor elements are wired in opposite directions such that one Hall sensor element 502 measures positive current, I, and the other Hall sensor element 504 measures negative current, −I. Both the Hall sensor elements are oriented in the same direction. Thus, the systematic error due to external magnetic fields measured by both Hall sensor elements is the same. The current measurement from Hall sensor element 502 is:

$$I^{m1}=I+e_m+e' \quad \text{(equation 18)}$$

where $I^m$ is the measured current, I is the true current, and $e_m$ is the error due to external magnetic fields, and e' is other sources of error (such as error due to thermal drift). The current measurement from Hall sensor element 504 is:

$$I^{m2}=-I+e_m+e' \quad \text{(equation 19)}$$

On receiving these current measurement readings from these Hall sensor elements, the controller determines the current measurement of the Hall sensor as a whole by calculating the difference between the current measurement readings and then halving the result:

$$I^m = \frac{I^{m1} - I^{m2}}{2} \quad \text{(equation 20)}$$

$$I^m = I + e' \quad \text{(equation 21)}$$

The error due to external magnetic fields $e_m$ is thereby eliminated from the current measurement of the Hall sensor, $I^m$.

In FIG. 6, the Hall sensor elements are arranged side by side on the circuit board. The Hall sensor elements are wired in parallel. Both Hall sensor elements 602 and 604 measure positive current, I/2. The Hall sensor elements are in opposing orientations. Thus, the systematic error due to external magnetic fields measured by Hall sensor element 602 is opposite to the systematic error due to external magnetic fields measured by Hall sensor element 604. The current measurement from Hall sensor element 602 is:

$$I^{m1} = \frac{1}{2} + \frac{e_m}{2} + \frac{e'}{2} \quad \text{(equation 22)}$$

where $I^m$ is the measured current, I is the true current, and $e_m$ is the error due to external magnetic fields, and e' is other sources of error (such as error due to thermal drift).

The current measurement from Hall sensor element 604 is:

$$I^{m2} = \frac{1}{2} - \frac{e_m}{2} + \frac{e'}{2} \quad \text{(equation 23)}$$

On receiving these current measurement readings from these Hall sensor elements, the controller determines the current measurement of the Hall sensor as a whole by adding the current measurement readings together:

$$I^m = I^{m1} + I^{m2} \quad \text{(equation 24)}$$

$$I^m = I + e' \quad \text{(equation 25)}$$

The error due to external magnetic fields $e_m$ is thereby eliminated from the current measurement of the Hall sensor, $I^m$.

The Hall sensor elements may interfere with each other. The current flowing through the wire in one Hall sensor element creates a magnetic field that can interfere with the measurement made by the other Hall sensor element. The sensor arrangement of FIG. 4 has a greater susceptibility to this interference than the arrangements of FIGS. 5 and 6. However, the error due to external magnetic fields, $e_m$, is better matched for the sensor element pair on FIG. 4 than the sensor element pairs of FIGS. 5 and 6. The error in one Hall sensor element's measurement due to the magnetic field of the other Hall sensor element has been determined to be approximately 4%. The controller 106 may be configured to correct the Hall voltages it receives from the Hall sensor elements for this error.

In an exemplary implementation, each Hall sensor element of a Hall sensor is calibrated individually for its temperature dependence using the method described herein.

The Hall sensors may be magnetically shielded in order to reduce the error in the Hall sensor measurements caused by external magnetic fields. This shielding may act to uniformly distribute external magnetic fields over the Hall sensors. Thus, each Hall sensor experiences the same interference from the external magnetic fields. The shield may be a single layer on the opposing side to the Hall sensors than the circuit board on which the Hall sensors are mounted. The layer may be parallel to the circuit board. The shield may be two layers, one on either side of the circuit board on which the Hall sensors are mounted. These two layers may be parallel to the circuit board. The shield may comprise a further shield element located between the Hall sensors 114 and the motor 104.

The shield may be composed of Mu-metal. Mu-metal has a high magnetic permeability which draws magnetic field lines to it rather than the region it protects. The Mu-metal shield is therefore itself a source of magnetic interference for the Hall sensors. Thus, the Mu-metal shield is located sufficiently far away from the Hall sensors so as not to interfere with their current measurements. Additionally, the Mu-metal shield saturates. Thus, the Mu-metal shield is sized sufficiently large to absorb the external fields that the motor control circuit is expected to be subject to before saturation.

Any one or more of the above described circuitry for mitigating the thermal and/or electromagnetic sensitivity of Hall sensors may be used in combination in the motor control circuit.

The motor control circuit 100 is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. The methods described herein may be performed by software in machine readable form on a tangible storage medium. Software can be provided at the computing-based device to implement the methods described herein. For example, the error corrector of the controller may comprise error correcting logic to correct the current sensor readings received from the Hall sensors. The calibrator of the controller may comprise calibrating logic to perform the calibration described herein.

The motor 104 being controlled by the motor control circuit 100 may be used to drive movement of a joint which connects limbs of a robot. For example, the motor may be used to drive a joint in a surgical robot arm. It is desirable to make surgical robot arms as compact as possible. The motor for driving the actuation of a joint of a surgical robot arm is preferably located proximal to the joint. Thus, the motor control circuit 100, including the current sensors 114, are preferably as small as possible. Surgical robots are subject to maximum power limits and also to temperature limits. Utilising the circuitry and methods described herein enables a small Hall sensor to provide an accurate, temperature stable and non-intrusive current measurement and is hence suitable for incorporation into a motor control circuit of a surgical robot.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit for mitigating thermal sensitivity in a motor wherein a phase of the motor receives a driving current, the circuit comprising:
   a current sensor configured to measure the driving current for the phase of the motor, wherein the current sensor comprises a Hall sensor configured to output a Hall voltage, the measured driving current being a function of the Hall voltage;
   the controller configured to:
      receive a first calibration temperature measurement from a temperature sensor configured to measure the circuit temperature and a first calibration Hall voltage from the current sensor, both measurements taken concurrently during circuit disconnection;
      receive a second calibration temperature measurement from the temperature sensor and a second calibration Hall voltage from the current sensor, both measurements taken concurrently during circuit connection; and
      derive a thermal calibration profile of the Hall voltage of the current sensor from the received calibration measurements.

2. The circuit as claimed in claim 1, further comprising a driver configured to generate the driving current for the phase of the motor.

3. The circuit as claimed in claim 2, wherein the driver is configured to generate a succeeding driving current of the phase of the motor in response to a control input, the control input comprising an estimate of the driving current of the phase.

4. The circuit as claimed in claim 1, wherein the motor is a multiple-phase motor and the circuit comprises a current sensor for each phase of the multiple-phase motor, wherein the controller is further configured to, for each phase of the multiple-phase motor, generate an estimate of the driving current of that phase to be the measured driving current of that phase minus 1/n of the total of the measured driving currents for all phases, n being the number of phases of the multiple-phase motor.

5. The circuit as claimed in claim 1, wherein the motor is a multiple-phase motor and the circuit comprises a current sensor for each phase of the multiple-phase motor, wherein the controller is configured to generate an estimate of the error of each measured driving current to be equal to 1/n of the total of the measured driving currents for all phases, n being the number of phases of the multiple-phase motor.

6. The circuit as claimed in claim 1, wherein the current sensor comprises a plurality of current sensor elements, each current sensor element configured to measure the driving current of the phase thereby generating a driving current reading, the measured driving current of the phase being a combination of the driving current readings of the current sensor elements.

7. The circuit as claimed in claim 6, wherein the plurality of current sensor elements of the current sensor are arranged with respect to each other such that each current sensor element has the same magnitude of driving current systematic error due to magnetic fields external to the driving current to be measured.

8. The circuit as claimed in claim 7, wherein the plurality of current sensor elements of the current sensor comprises two current sensor elements arranged in an opposing orientation.

9. The circuit as claimed in claim 8, wherein the controller is configured to calculate the measured driving current of the phase to be half the sum of the driving current readings of the two current sensor elements.

10. The circuit as claimed in claim 7, wherein the plurality of current sensor elements of the current sensor comprises two current elements arranged in the same orientation and wired in series in opposition, wherein the controller is configured to calculate the measured driving current of the phase to be half the difference of the driving current readings of the two current sensor elements.

11. The circuit as claimed in claim 7, wherein the plurality of current sensor elements of the current sensor comprises two current elements arranged in an opposing orientation and wired in parallel, wherein the controller is configured to calculate the measured driving current of the phase to be the sum of the driving current readings of the two current sensor elements.

12. The circuit as claimed in claim 1, wherein the controller is configured to generate an estimate of a driving current of the phase and calibrate the measured driving current of the phase prior to generating the estimate of the driving current.

13. The circuit as claimed in claim 12, wherein the thermal calibration profile is linear, and the controller is configured to calibrate the measured driving current of the phase by deducting a linear offset from each driving current reading of the current sensor of the phase in accordance with the thermal calibration profiles of the current sensor.

14. The circuit as claimed in claim 1, wherein the controller is configured to receive the first calibration temperature measurement and the first calibration Hall voltage which were taken during circuit disconnection at start-up.

15. The circuit as claimed in claim 1, wherein the controller is configured to receive the first calibration temperature measurement and the first calibration Hall voltage which were taken during a period of motor disconnection during use.

16. The circuit as claimed in claim 1, wherein the controller is configured to receive the second calibration temperature measurement and the second calibration Hall voltage which were taken during circuit connection when the driving current of the phase was momentarily driven to zero by the driver following a period of higher driving current of the phase.

17. The circuit as claimed in claim 1, wherein the controller is configured to calibrate the Hall voltage from the current sensor using the thermal calibration profile of the calibrated current sensor.

18. The circuit as claimed in claim 1, further comprising a magnetic shield which encompasses the current sensor.

19. The circuit as claimed in claim 1, further comprising a temperature sensor configured to measure the circuit temperature, and output a measured circuit temperature to the controller.

20. The circuit as claimed in claim 1, wherein the motor is a multiple-phase motor, and the circuit comprises a current sensor for each phase of the multiple-phase motor, each current sensor configured to measure the driving current of that phase.

* * * * *